(12) United States Patent
Hsieh et al.

(10) Patent No.: US 9,118,319 B2
(45) Date of Patent: Aug. 25, 2015

(54) RECONFIGURABLE CIRCUIT BLOCK SUPPORTING DIFFERENT INTERCONNECTION CONFIGURATIONS FOR RATE-CONVERSION CIRCUIT AND PROCESSING CIRCUIT AND RELATED METHOD THEREOF

(71) Applicant: MEDIATEK INC., Hsin-Chu (TW)

(72) Inventors: Ming-Yu Hsieh, Taichung (TW); Khurram Muhammad, Winston-Salem, NC (US); Pou-Chi Chang, Hsinchu (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/280,651

(22) Filed: May 18, 2014

(65) Prior Publication Data
US 2014/0347094 A1    Nov. 27, 2014

Related U.S. Application Data

(60) Provisional application No. 61/825,630, filed on May 21, 2013.

(51) Int. Cl.
| | |
|---|---|
| G06F 7/38 | (2006.01) |
| H03K 19/173 | (2006.01) |
| H03K 19/0175 | (2006.01) |
| H03F 3/217 | (2006.01) |
| H04L 27/34 | (2006.01) |
| H04B 1/04 | (2006.01) |
| H04W 24/02 | (2009.01) |
| H04L 25/02 | (2006.01) |

(Continued)

(52) U.S. Cl.
CPC ........ *H03K 19/017509* (2013.01); *G01R 21/06* (2013.01); *G01R 23/00* (2013.01); *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01); *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

(58) Field of Classification Search
USPC ......................................... 326/37–41, 46–47
See application file for complete search history.

(56) References Cited

U.S. PATENT DOCUMENTS

| | | | |
|---|---|---|---|
| 6,343,207 B1 * | 1/2002 | Hessel et al. ..................... 455/86 |
| 8,750,526 B1 * | 6/2014 | Santos et al. ..................... 381/56 |

*Primary Examiner* — Anh Tran
(74) *Attorney, Agent, or Firm* — Winston Hsu; Scott Margo (57) ABSTRACT

A reconfigurable circuit block includes a rate-conversion circuit, a processing circuit, a first asynchronous interface circuit, and a second asynchronous interface circuit. The rate-conversion circuit converts a first input signal into a first output signal. The processing circuit processes a second input signal to generate a second output signal. The first asynchronous interface circuit outputs a third output signal asynchronous with the first output signal. The second asynchronous interface circuit outputs a fourth output signal asynchronous with the second output signal. The controllable interconnection circuit transmits the third output signal to the processing circuit to serve as the second input signal when controlled to have a first interconnection configuration, and transmits the fourth output signal to the rate-conversion circuit to serve as the first input signal when controlled to have a second interconnection configuration.

22 Claims, 5 Drawing Sheets

(51) Int. Cl.
*H04L 25/08* (2006.01)
*H03M 1/12* (2006.01)
*H04L 7/00* (2006.01)
*G01R 21/06* (2006.01)
*G01R 23/00* (2006.01)
*H03F 1/24* (2006.01)
*H04L 27/20* (2006.01)

RECONFIGURABLE CIRCUIT BLOCK SUPPORTING DIFFERENT INTERCONNECTION CONFIGURATIONS FOR RATE-CONVERSION CIRCUIT AND PROCESSING CIRCUIT AND RELATED METHOD THEREOF

CROSS REFERENCE TO RELATED APPLICATIONS

This application claims the benefit of U.S. provisional application No. 61/825,630, filed on May 21, 2013 and incorporated herein by reference.

BACKGROUND

The disclosed embodiments of the present invention relate to adjusting a data path between two circuit components, and more particularly, to a reconfigurable circuit block supporting different interconnection configurations for a rate-conversion circuit and a processing circuit and a related method thereof.

In a conventional signal processing system, some circuit blocks may be configured to operate at clock frequencies each derived from a first reference clock source, and some blocks may be configured to operate at clock frequencies each derived from a second reference clock source, where a second reference clock provided by the second reference clock source is asynchronous with a first reference clock provided by the first reference clock source (e.g., one of the first reference clock frequency and the second reference clock frequency is not an integer multiple of the other of the first reference clock frequency and the second reference clock frequency). Therefore, it is essential to include a sampling rate converter in the conventional signal processing system to translate one digital signal sampled at one sampling rate to another digital signal sampled at another sampling rate. However, the arrangement of circuit blocks before the sampling rate converter and circuit blocks after the sampling rate converter may affect the performance of the conventional signal processing system under different scenarios.

Thus, there is a need for a reconfigurable circuit design which is capable of properly changing the arrangement of circuit blocks before the sampling rate converter and circuit blocks after the sampling rate converter to make the signal processing system have optimum performance for different scenarios.

SUMMARY

In accordance with exemplary embodiments of the present invention, a reconfigurable circuit block supporting different interconnection configurations for a rate-conversion circuit and a processing circuit and a related method thereof are proposed to solve the above-mentioned problem.

According to a first aspect of the present invention, an exemplary reconfigurable circuit block is disclosed. The exemplary reconfigurable circuit block includes a rate-conversion circuit, a processing circuit, a first asynchronous interface circuit, and a second asynchronous interface circuit. The rate-conversion circuit is configured to convert a first input signal with a first data rate into a first output signal with a second data rate that is different from the first data rate. The processing circuit is configured to perform a predetermined signal processing operation upon a second input signal to generate a second output signal. The first asynchronous interface circuit is configured to receive the first output signal, and output a third output signal asynchronous with the first output signal. The second asynchronous interface circuit is configured to receive the second output signal, and output a fourth output signal asynchronous with the second output signal. The controllable interconnection circuit is coupled to the rate-conversion circuit, the processing circuit, the first asynchronous interface circuit, and the second asynchronous interface circuit. The controllable interconnection circuit is configured to transmit the third output signal to the processing circuit to serve as the second input signal when controlled to have a first interconnection configuration, and transmit the fourth output signal to the rate-conversion circuit to serve as the first input signal when controlled to have a second interconnection configuration.

According to a second aspect of the present invention, an exemplary method for configuring a circuit block having a rate-conversion circuit and a processing circuit is disclosed. The exemplary method includes: using the rate-conversion circuit to convert a first input signal with a first data rate into a first output signal with a second data rate that is different from the first data rate; using the processing circuit to perform a predetermined signal processing operation upon a second input signal to generate a second output signal; when the circuit block is configured to employ a first interconnection configuration, receiving the first output signal, and outputting a third output signal asynchronous with the first output signal to the processing circuit to serve as the second input signal; and when the circuit block is configured to employ a second interconnection configuration, receiving the second output signal, and outputting a fourth output signal asynchronous with the second output signal to the rate-conversion circuit to serve as the first input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention proposes a reconfigurable circuit design which can adaptively adjust the connection order of a rate-conversion circuit and a processing circuit to meet the requirement of a signal processing system (e.g., a wireless communication apparatus at a transmitter (TX) side or a receiver (RX) side) under different scenarios. For example, when an input signal of the signal processing system has a first characteristic, it may be preferable to place the processing circuit after the rate-conversion circuit to achieve better output signal quality; and when the input signal of the signal processing system has a second characteristic, it may be preferable to place the processing circuit before the rate-conversion circuit to achieve lower power consumption. Since the rate-conversion circuit and the processing circuit are re-used to form a new circuit configuration for power saving, there is no need to use two sets of the rate-conversion circuit and the processing circuit. In this way, the reconfigurable circuit design is able to achieve both power optimization and area optimization. Further details of the reconfigurable circuit design are described as below.

Figure 1:
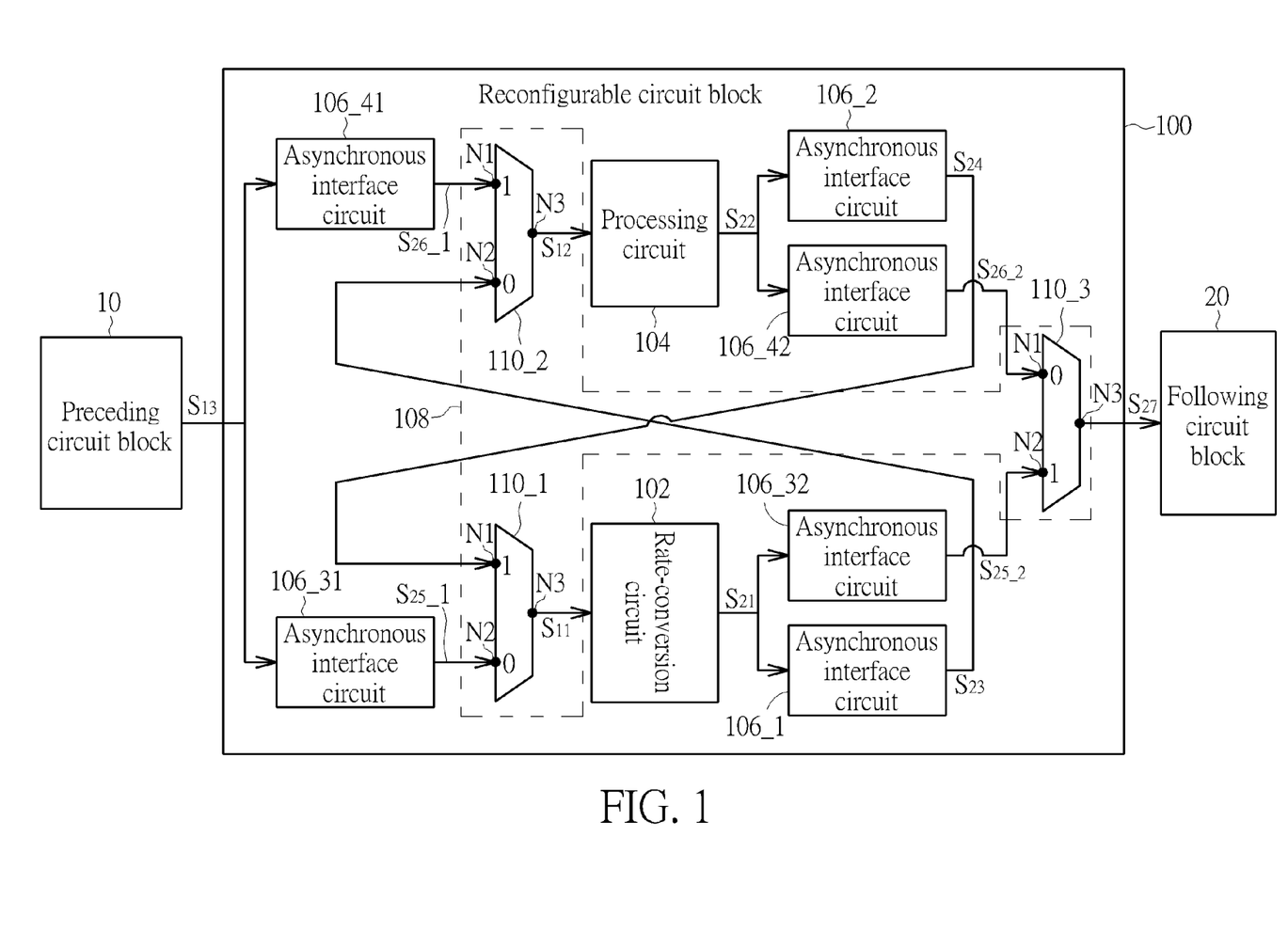
FIG. 1 is a diagram illustrating a reconfigurable circuit block according to an embodiment of the present invention.

Please refer to FIG. 1, which is a diagram illustrating a reconfigurable circuit block according to an embodiment of the present invention. The reconfigurable circuit block 100 is coupled between a preceding circuit block 10 and a following circuit block 20. Hence, the reconfigurable circuit block 100 receives an input signal $S_{13}$ generated from the preceding circuit block 10, and then processes the input signal $S_{13}$ to generate an output signal $S_{27}$ to the following circuit block 20. In this embodiment, the reconfigurable circuit block 100 includes a rate-conversion circuit 102, a processing circuit 104, a plurality of asynchronous interface circuits 106_1, 106_2, 106_31, 106_32, 106_41, 106_42, and a controllable interconnection circuit 108.

The controllable interconnection circuit 108 includes a plurality of switches (or multiplexers) 110_1, 110_2, 110_3, each having a first input port N1, a second input port N2, and an output port N3. Concerning the switch 110_1, the input port N1 is coupled to the asynchronous interface circuit 106_2, the second input port N2 is coupled to the asynchronous interface circuit 106_31, and the output port N3 is coupled to the rate-conversion circuit 102. Concerning the switch 1102, the input port N1 is coupled to the asynchronous interface circuit 106_41, the second input port N2 is coupled to the asynchronous interface circuit 106_1, and the output port N3 is coupled to the processing circuit 104. Concerning the switch 110_3, the input port N1 is coupled to the asynchronous interface circuit 106_42, the second input port N2 is coupled to the asynchronous interface circuit 106_32, and the output port N3 is coupled to the following circuit block 20.

The rate-conversion circuit 102 is configured to convert an input signal $S_{11}$ with a first data rate (i.e., a first sampling rate) into an output signal $S_{21}$ with a second data rate (i.e., a second sampling rate) that is different from the first data rate. The processing circuit 104 is configured to perform a predetermined signal processing operation upon an input signal $S_{12}$ to generate an output signal $S_{22}$. For example, the preceding circuit block 10, the reconfigurable circuit block 100 and the following circuit block 20 may be included in a wireless communication apparatus such as a wireless transmitter or a wireless receiver, where the rate-conversion circuit 102 may at least include a sampling rate converter, and the processing circuit 104 may be a digital pre-distortion (DPD) circuit.

By way of example, but not limitation, each of the asynchronous interface circuits 106_1, 106_2, 106_31, 106_32, 106_41, 106_42 may be implemented by a ring-type asynchronous first-in first-out (FIFO) buffer using separate input clock, input enable signal, output clock and output enable signal. In addition, each ring-type asynchronous FIFO buffer may include 3~5 flip-flop stages, depending upon actual design consideration. Therefore, each ring-type asynchronous FIFO buffer can provide clock-domain isolation between its input and output. That is, the input signals and the output signals of each ring-type asynchronous FIFO buffer can operate at different clock domains. More particularly, the input signals and the output signals of each ring-type asynchronous FIFO buffer can operate under different phase characteristics. The asynchronous interface circuit 106_1 is configured to receive the output signal $S_{21}$, and output an output signal $S_{23}$ asynchronous with the output signal $S_{21}$. The asynchronous interface circuit 106_2 is configured to receive the output signal $S_{22}$, and output an output signal $S_{24}$ asynchronous with the output signal $S_{22}$. The asynchronous interface circuit 106_31 is configured to receive the input signal $S_{13}$ generated from the preceding circuit block 10, and output an output signal $S_{25\_1}$ asynchronous with the input signal $S_{13}$. The asynchronous interface circuit 106_41 is configured to receive the input signal $S_{13}$ generated from the preceding circuit block 10, and output an output signal $S_{26\_1}$ asynchronous with the input signal $S_{13}$. The asynchronous interface circuit 106_32 is configured to receive the output signal $S_{21}$, and output an output signal $S_{25\_2}$ asynchronous with the output signal $S_{21}$. The asynchronous interface circuit 106_42 is configured to receive the output signal $S_{22}$, and output an output signal $S_{26\_2}$ asynchronous with the output signal $S_{22}$.

The circuit elements shown in FIG. 1 may be operated in different clock domains that use clocks with different frequencies and/or different phases. By way of example, but not limitation, the preceding circuit block 10 may be operated in a first clock domain; an input side of the asynchronous interface circuit 106_41 may be operated in the first clock domain, and an output side of the asynchronous interface circuit 106_41 may be operated in a second clock domain; the switch 110_2 and the processing circuit 104 may be operated in the second clock domain; an input side of the asynchronous interface circuit 106_2 may be operated in the second clock domain, and an output side of the asynchronous interface circuit 106_2 may be operated in a third clock domain; an input side of the asynchronous interface circuit 106_31 may be operated in the first clock domain, and an output side of the asynchronous interface circuit 106_31 may be operated in the third clock domain; the switch 110_1 may be operated in the third clock domain; an input side of the rate-conversion circuit 102 may be operated in the third clock domain, and an output side of the rate-conversion circuit 102 may be operated in a fourth clock domain; an input side of the asynchronous interface circuit 106_1 may be operated in the fourth clock domain, and an output side of the asynchronous interface circuit 106_1 may be operated in the second clock domain; an input side of the asynchronous interface circuit 106_42 may be operated in the second clock domain, and an output side of the asynchronous interface circuit 106_42 may be operated in a fifth clock domain; an input side of the asynchronous interface circuit 106_32 may be operated in the fourth clock domain, and an output side of the asynchronous interface circuit 106_32 may be operated in the fifth clock domain; and the switch 110_3 and the following circuit block 20 may be operated in the fifth clock domain.

As shown in FIG. 1, the controllable interconnection circuit 108 is coupled to the rate-conversion circuit 102, the processing circuit 104 and the asynchronous interface circuits 106_1, 106_2, 106_31, 106_32, 106_41, 106_42. The controllable interconnection circuit 108 is implemented to configure the interconnection of the rate-conversion circuit 102, the processing circuit 104 and the asynchronous interface circuits 106_1, 106_2, 106_31, 106_32, 106_41, 106_42. In this embodiment, the controllable interconnection circuit 108 may be controlled to switch between a first interconnection configuration and a second interconnection configuration, where the first interconnection configuration is enabled for meeting one signal processing requirement (e.g., high output signal quality), and the second interconnection configuration is enabled for meeting another signal processing requirement (e.g., low power consumption).

More specifically, when the controllable interconnection circuit 108 is controlled to have the first interconnection configuration, the output port N3 of the switch 110_1 is coupled to the second input port N2 of the switch 110_1, and disconnected from the first input port N1 of the switch 110_1; the output port N3 of the switch 110_2 is coupled to the second input port N2 of the switch 110_2, and disconnected from the first input port N1 of the switch 110_2; and the output port N3 of the switch 1103 is coupled to the first input port N1 of the switch 110_3, and disconnected from the second input port N2 of the switch 110_3.

Figure 2:
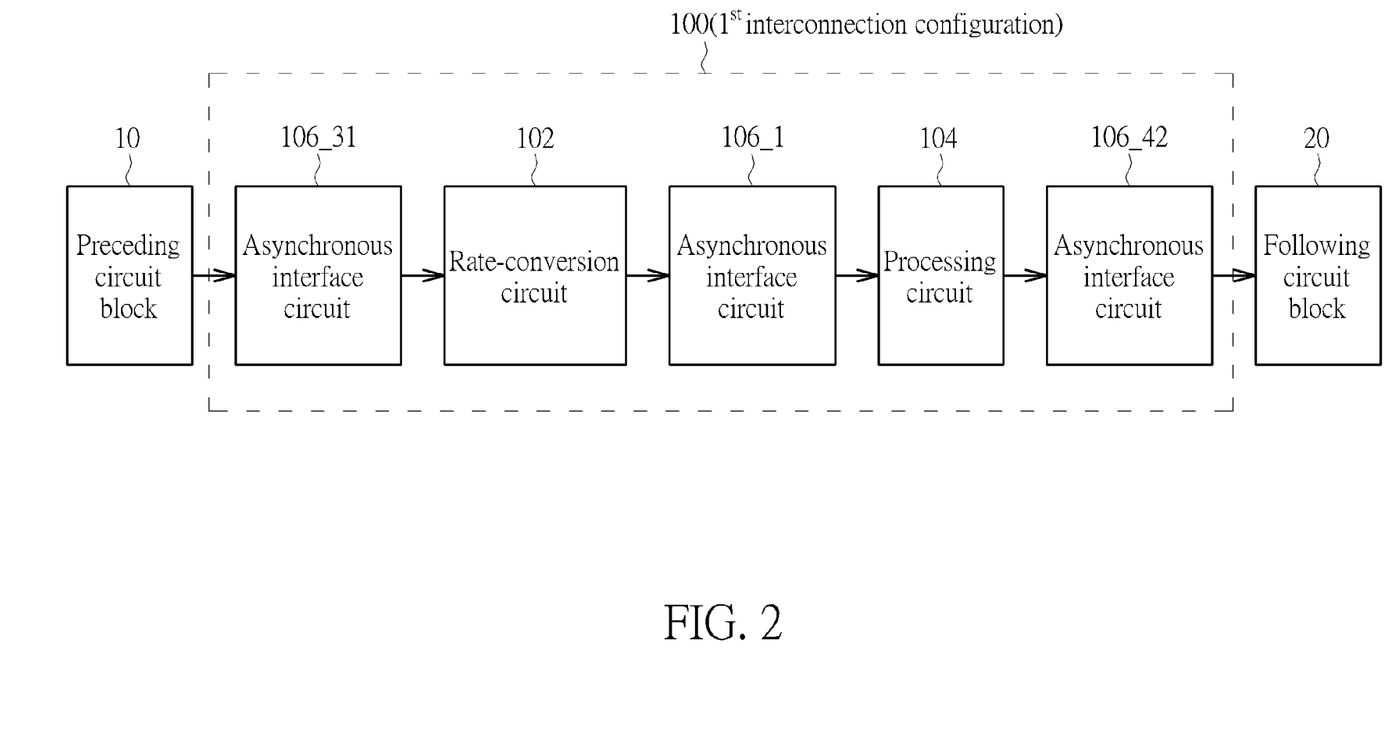
FIG. 2 is a diagram illustrating an equivalent circuit generated due to the controllable interconnection circuit controlled to have the first interconnection configuration.

Please refer to FIG. 2 in conjunction with FIG. 1. FIG. 2 is a diagram illustrating an equivalent circuit generated due to the controllable interconnection circuit controlled to have the first interconnection configuration. The input signal $S_{13}$ generated from the preceding circuit block 10 is sequentially processed by asynchronous interface circuit 106_31, rate-conversion circuit 102, asynchronous interface circuit 106_1, processing circuit 104, and asynchronous interface circuit 106_42, and the output signal $S_{26}\_2$ generated from the asynchronous interface circuit 106_42 is transmitted to the following circuit block 20 to serve as the output signal $S_{27}$ to be processed by the following circuit block 20. Hence, when controlled to have the first interconnection configuration, the controllable interconnection circuit 108 is configured to transmit the output signal $S_{25}\_1$ to the rate-conversion circuit 102 to serve as the input signal $S_{11}$, and transmit the output signal $S_{23}$ to the processing circuit 104 to serve as the input signal $S_{12}$. In other words, the rate-conversion circuit 102 is followed by the processing circuit 104 under the first interconnection configuration. It should be noted that the asynchronous interface circuits 106_31, 106_1 and 106_42 are used to sustain the required clock balance. Further, non-used asynchronous interface circuits 106_32, 106_41 and 106_2 may be powered off by setting respective enable signals for power saving.

When the controllable interconnection circuit 108 is controlled to have the second interconnection configuration, the output port N3 of the switch 110_1 is coupled to the first input port N1 of the switch 110_1, and disconnected from the second input port N2 of the switch 110_1; the output port N3 of the switch 110_2 is coupled to the first input port N1 of the switch 110_2, and disconnected from the second input port N2 of the switch 110_2; and the output port N3 of the switch 110_3 is coupled to the second input port N2 of the switch 110_3, and disconnected from the first input port N1 of the switch 110_3.

Figure 3:
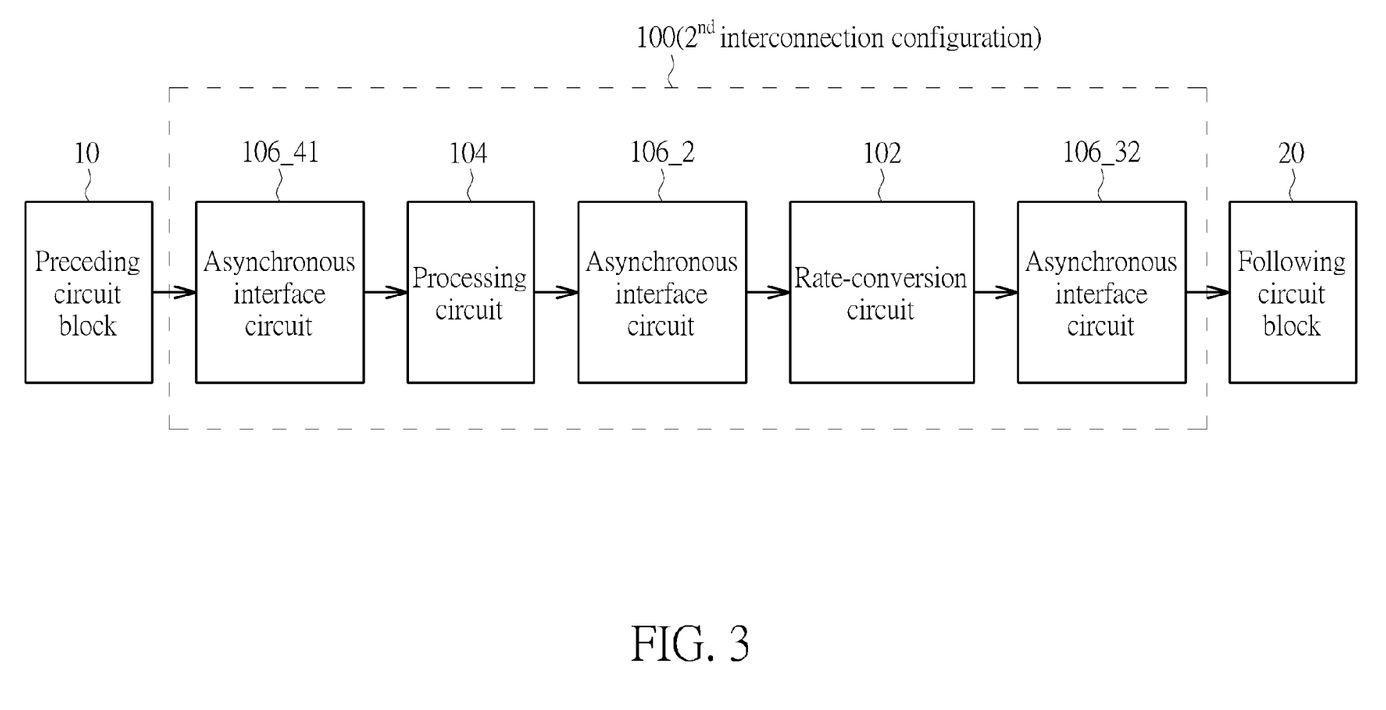
FIG. 3 is a diagram illustrating an equivalent circuit generated due to the controllable interconnection circuit controlled to have the second interconnection configuration.

Please refer to FIG. 3 in conjunction with FIG. 1. FIG. 3 is a diagram illustrating an equivalent circuit generated due to the controllable interconnection circuit controlled to have the second interconnection configuration. The input signal $S_{13}$ generated from the preceding circuit block 10 is sequentially processed by asynchronous interface circuit 106_41, processing circuit 104, asynchronous interface circuit 106_2, rate-conversion circuit 102, and asynchronous interface circuit 106_32, and the output signal $S_{25}\_2$ generated from the asynchronous interface circuit 106_32 is transmitted to the following circuit block 20 to serve as the output signal $S_{27}$ to be processed by the following circuit block 20. Hence, when controlled to have the second interconnection configuration, the controllable interconnection circuit 108 is configured to transmit the output signal $S_{26}\_1$ to the processing circuit 104 to serve as the input signal $S_{12}$, and transmit the output signal $S_{24}$ to the rate-conversion circuit 102 to serve as the input signal $S_{11}$. In other words, the processing circuit 104 is followed by the rate-conversion circuit 102 under the second interconnection configuration. It should be noted that the asynchronous interface circuits 106_41, 106_2 and 106_32 are used to sustain the required clock balance. Further, non-used asynchronous interface circuits 106_31, 106_42 and 106_1 may be powered off by setting respective enable signals for power saving.

As mentioned above, the reconfigurable circuit block 100 may be part of a wireless communication apparatus. Hence, the second data rate of the output signal $S_{21}$ generated from the rate-conversion circuit 102 may be higher than the first data rate of the input signal $S_{11}$ fed into the rate-conversion circuit 102. Further, the processing circuit 104 is operated at a first clock speed when the controllable interconnection circuit 108 is controlled to have the first interconnection configuration, and is operated at a second clock speed slower that the first clock speed when the controllable interconnection circuit 108 is controlled to have the second interconnection configuration.

In a first exemplary design, the wireless communication apparatus may be a multi-mode communication apparatus supporting different communication standards, including the enhanced data GSM environment (EDGE) telecommunications technology, the third generation (3G) of telecommunications technology, the fourth generation (4G) of telecommunications technology, the Bluetooth (BT) technology, and/or the wireless fidelity (WiFi) technology. The controllable interconnection circuit 108 is controlled to have the first interconnection configuration when the multi-mode communication apparatus is operated under one communication mode (e.g., 4G mode or WiFi mode), and is controlled to have the second interconnection configuration when the multi-mode communication apparatus is operated under a different communication mode (e.g., 3G/EDGE mode or BT mode).

Figure 4:
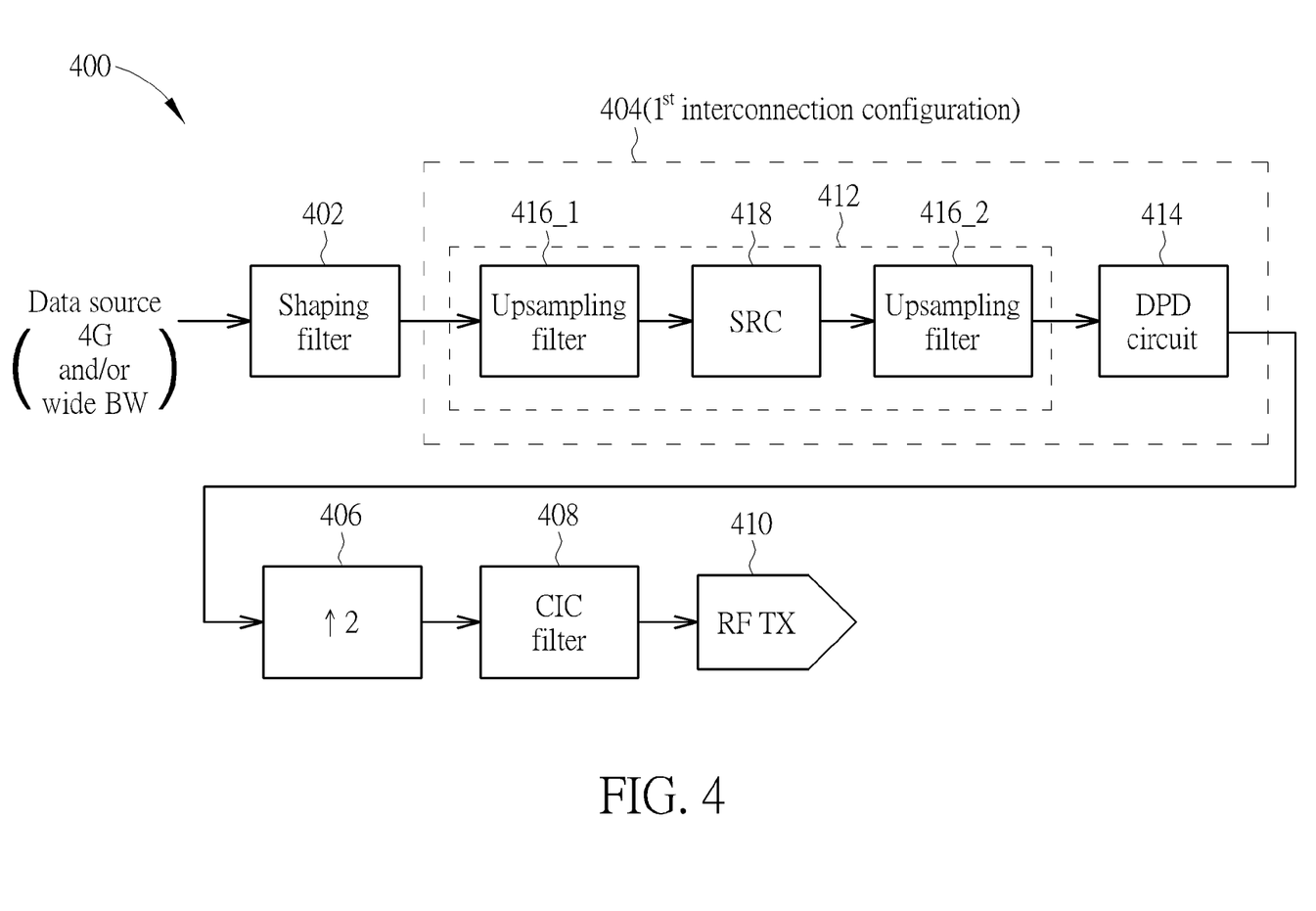
FIG. 4 is a diagram illustrating an equivalent circuit of a wireless communication apparatus using a proposed reconfigurable circuit block that is configured to have the first interconnection configuration according to an embodiment of the present invention.

Please refer to FIG. 4, which is a diagram illustrating an equivalent circuit of a wireless communication apparatus using a proposed reconfigurable circuit block that is configured to have the first interconnection configuration according to an embodiment of the present invention. The wireless communication apparatus 400 may be a multi-mode transmitter apparatus. In this embodiment shown in FIG. 4, the wireless communication apparatus 400 may be operated under a 4G mode. The wireless communication apparatus 400 includes, but is not limited to, a shaping filter 402, a reconfigurable circuit block 404, an upsampling filter 406, a cascaded integrator comb (CIC) filter 408, and a radio-frequency transmitter (RF TX) 410. The reconfigurable circuit block 404 employs the architecture of the reconfigurable circuit 100 shown in FIG. 1, where the DPD circuit 414 acts as the aforementioned processing circuit 104, the rate-conversion circuit 412 acts as the aforementioned rate-conversion circuit 102, the shaping filter 402 acts as the aforementioned preceding circuit block 10, and the upsampling filter 406 acts as the aforementioned following circuit block 20. Since the reconfigurable circuit block 404 is configured to employ the aforementioned first interconnection configuration, the rate-conversion circuit 412 is followed by the DPD circuit 414. In this embodiment, the rate-conversion circuit 412 includes a plurality of upsampling filters 416_1, 416_2, and a sampling rate converter (SRC) 418 coupled between the upsampling filters 416_1, 416_2. The upsampling filter 416_1 is configured to perform a first upsampling filtering operation upon the input signal $S_{11}$ (which is derived from an input signal generated from the shaping filter 402); the SRC 418 is configured to perform a sampling rate conversion upon an output of the upsampling filter 416_1; and the upsampling filter 416_2 is configured to perform a second upsampling filtering operation upon an output of the SRC 418 to generate the output signal $S_{21}$ to be processed by the DPD circuit 414. Please note that asynchronous interface circuits are omitted in FIG. 4 for clarity and simplicity.

For a wide-bandwidth input signal, DPD 414 is required to be operated at a high clock speed and placed as close as possible to the RF transmitter 410 due to its spectrum regrowth and bandwidth-expansion effect. As shown in FIG. 4, the arrangement of the rate-conversion circuit 412 and the DPD circuit 414 ensures the quality of the analog RF output signal generated from the RF transmitter 410.

Figure 5:
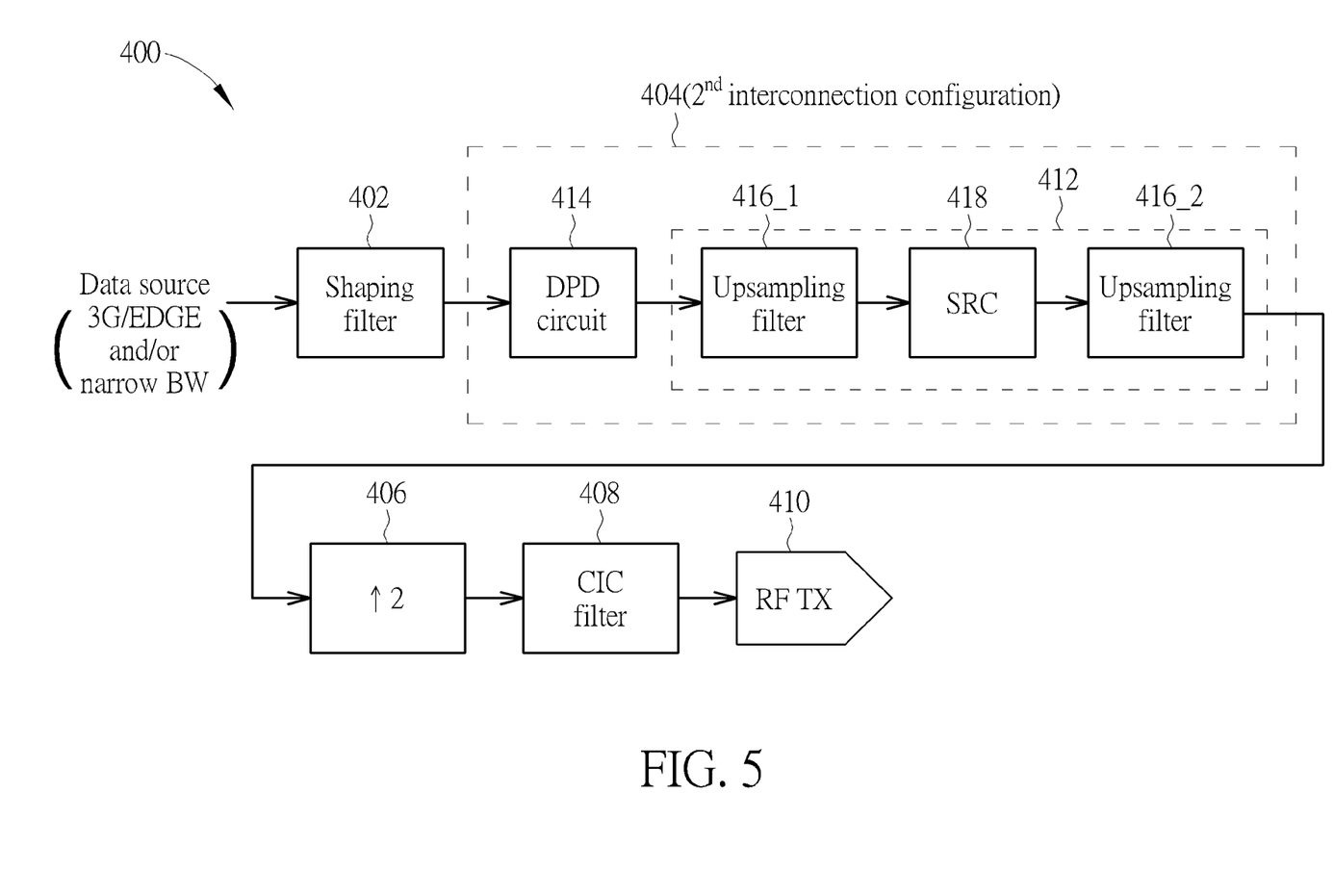
FIG. 5 is a diagram illustrating an equivalent circuit of a wireless communication apparatus using a proposed reconfigurable circuit block that is configured to have the second interconnection configuration according to an embodiment of the present invention.

Please refer to FIG. 5, which is a diagram illustrating an equivalent circuit of a wireless communication apparatus using a proposed reconfigurable circuit block that is configured to have the second interconnection configuration according to an embodiment of the present invention. As shown in FIG. 5, the wireless communication apparatus 400 is operated under a 3G/EDGE mode. Since the reconfigurable circuit block 404 is configured to employ the aforementioned second interconnection configuration, the DPD circuit 414 is followed by the rate-conversion circuit 412. In addition, the DPD circuit 414 is operated at a slower clock speed. In this embodiment, the upsampling filter 416_1 is configured to perform a first upsampling filtering operation upon the input signal $S_{11}$ (which is derived from an output signal generated from the DPD circuit 414); the SRC 418 is configured to perform a sampling rate conversion upon an output of the upsampling filter 416_1; and the upsampling filter 416_2 is configured to perform a second upsampling filtering operation upon an output of the SRC 418 to generate the output signal $S_{21}$ to be processed by the upsampling filter 406. Please note that asynchronous interface circuits are omitted in FIG. 5 for clarity and simplicity. For a narrow-bandwidth input signal, the DPD 414 can be implemented to be close to the data source, thus consuming less power.

In above example, the wireless communication apparatus 400 may be a multi-mode communication apparatus capable of switching between different interconnection configurations for different communication modes. However, this is for illustrative purposes only, and is not meant to be a limitation of the present invention. In a second exemplary design, the wireless communication apparatus 400 may be a single-mode communication apparatus supporting different signal bandwidths. Therefore, when the wireless communication apparatus 400 is operated under a wide input signal bandwidth, the controllable interconnection circuit (now shown) of the reconfigurable circuit block 404 is controlled to have the first interconnection configuration, as illustrated in FIG. 4; and when the wireless communication apparatus 400 is operated under a narrow input signal bandwidth, the controllable interconnection circuit (now shown) of the reconfigurable circuit block 404 is controlled to have the second interconnection configuration, as illustrated in FIG. 5. This also falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reconfigurable circuit block, comprising:
   a rate-conversion circuit, configured to convert a first input signal with a first data rate into a first output signal with a second data rate that is different from the first data rate;
   a processing circuit, configured to perform a predetermined signal processing operation upon a second input signal to generate a second output signal;
   a first asynchronous interface circuit, configured to receive the first output signal, and output a third output signal asynchronous with the first output signal;
   a second asynchronous interface circuit, configured to receive the second output signal, and output a fourth output signal asynchronous with the second output signal; and
   a controllable interconnection circuit, coupled to the rate-conversion circuit, the processing circuit, the first asynchronous interface circuit, and the second asynchronous interface circuit, wherein the controllable interconnection circuit is configured to transmit the third output signal to the processing circuit to serve as the second input signal when controlled to have a first interconnection configuration, and transmit the fourth output signal to the rate-conversion circuit to serve as the first input signal when controlled to have a second interconnection configuration.

2. The reconfigurable circuit block of claim 1, further comprising:
   a third asynchronous interface circuit, configured to receive a third input signal from a preceding circuit block, and output a fifth output signal asynchronous with the third input signal; and
   a fourth asynchronous interface circuit, configured to receive the third input signal from the preceding circuit block, and output a sixth output signal asynchronous with the third input signal;
   wherein the controllable interconnection circuit is further coupled to the third asynchronous interface circuit and the fourth asynchronous interface circuit, and configured to transmit the fifth output signal to the rate-conversion circuit to serve as the first input signal when controlled to have the first interconnection configuration, and transmit the sixth output signal to the processing circuit to serve as the second input signal when controlled to have the second interconnection configuration.

3. The reconfigurable circuit block of claim 2, wherein the controllable interconnection circuit comprises:
   a first switch, having a first input port coupled to the second asynchronous interface circuit, a second input port coupled to the third asynchronous interface circuit, and an output port coupled to the rate-conversion circuit; and
   a second switch, having a first input port coupled to the fourth asynchronous interface circuit, a second input port coupled to the first asynchronous interface circuit, and an output port coupled to the processing circuit;
   wherein when the controllable interconnection circuit is controlled to have the first interconnection configuration, the output port of the first switch is coupled to the second input port of the first switch, and the output port of the second switch is coupled to the second input port of the second switch; and when the controllable interconnection circuit is controlled to have the second interconnection configuration, the output port of the first switch is coupled to the first input port of the first switch, and the output port of the second switch is coupled to the first input port of the second switch.

4. The reconfigurable circuit block of claim 1, further comprising:
a third asynchronous interface circuit, configured to receive the first output signal, and output a fifth output signal asynchronous with the first output signal; and
a fourth asynchronous interface circuit, configured to receive the second output signal, and output a sixth output signal asynchronous with the second output signal;
wherein the controllable interconnection circuit is further coupled to the third asynchronous interface circuit and the fourth asynchronous interface circuit, and configured to transmit the sixth output signal to a following circuit block when controlled to have the first interconnection configuration, and transmit the fifth output signal to the following circuit block when controlled to have the second interconnection configuration.

5. The reconfigurable circuit block of claim 4, wherein the controllable interconnection circuit comprises:
a first switch, having an input port coupled to the second asynchronous interface circuit, and an output port coupled to the rate-conversion circuit;
a second switch, having an input port coupled to the first asynchronous interface circuit, and an output port coupled to the processing circuit; and
a third switch, having a first input port coupled to the fourth asynchronous interface circuit, a second input port coupled to the third asynchronous interface circuit, and an output port coupled to the following circuit block;
wherein when the controllable interconnection circuit is controlled to have the first interconnection configuration, the output port of the first switch is disconnected from the input port of the first switch, the output port of the second switch is coupled to the input port of the second switch, and the output port of the third switch is coupled to the first input port of the third switch; and when the controllable interconnection circuit is controlled to have the second interconnection configuration, the output port of the first switch is coupled to the input port of the first switch, the output port of the second switch is disconnected from the input port of the second switch, and the output port of the third switch is coupled to the second input port of the third switch.

6. The reconfigurable circuit block of claim 1, wherein the second data rate is higher than the first data rate.

7. The reconfigurable circuit block of claim 1, wherein the processing circuit is operated at a first clock speed when the controllable interconnection circuit is controlled to have the first interconnection configuration, and is operated at a second clock speed slower that the first clock speed when the controllable interconnection circuit is controlled to have the second interconnection configuration.

8. The reconfigurable circuit block of claim 1, wherein the reconfigurable circuit block is part of a wireless communication apparatus.

9. The reconfigurable circuit block of claim 8, wherein the processing circuit is a digital pre-distortion (DPD) circuit.

10. The reconfigurable circuit block of claim 8, wherein the rate-conversion circuit comprises:
a first upsampling filter, wherein the first input signal is fed into the first upsampling circuit;
a second upsampling filter, wherein the first output signal is generated from the second upsampling filter; and
a sampling rate converter, coupled between the first upsampling filter and the second upsampling filter.

11. The reconfigurable circuit block of claim 8, wherein the wireless communication apparatus is a multi-mode communication apparatus; and the controllable interconnection circuit is controlled to have the first interconnection configuration when the wireless communication apparatus is operated under one communication mode, and is controlled to have the second interconnection configuration when the wireless communication apparatus is operated under a different communication mode.

12. The reconfigurable circuit block of claim 8, wherein the wireless communication apparatus is a single-mode communication apparatus; and the controllable interconnection circuit is controlled to have the first interconnection configuration when the wireless communication apparatus is operated under one signal bandwidth, and is controlled to have the second interconnection configuration when the wireless communication apparatus is operated under a different signal bandwidth.

13. A method for configuring a circuit block having a rate-conversion circuit and a processing circuit, comprising:
using the rate-conversion circuit to convert a first input signal with a first data rate into a first output signal with a second data rate that is different from the first data rate;
using the processing circuit to perform a predetermined signal processing operation upon a second input signal to generate a second output signal;
when the circuit block is configured to employ a first interconnection configuration, receiving the first output signal, and outputting a third output signal asynchronous with the first output signal to the processing circuit to serve as the second input signal; and
when the circuit block is configured to employ a second interconnection configuration, receiving the second output signal, and outputting a fourth output signal asynchronous with the second output signal to the rate-conversion circuit to serve as the first input signal.

14. The method of claim 13, further comprising:
when the circuit block is configured to employ the first interconnection configuration, receiving a third input signal from a preceding circuit block, and outputting a fifth output signal asynchronous with the third input signal to the rate-conversion circuit to serve as the first input signal; and
when the circuit block is configured to employ the second interconnection configuration, receiving the third input signal from the preceding circuit block, and outputting a sixth output signal asynchronous with the third input signal to the processing circuit to serve as the second input signal.

15. The method of claim 13, further comprising:
when the circuit block is configured to employ the second interconnection configuration, receiving the first output signal, and outputting a fifth output signal asynchronous with the first output signal to a following circuit block; and
when the circuit block is configured to employ the first interconnection configuration, receiving the second output signal, and outputting a sixth output signal asynchronous with the second output signal to the following circuit block.

16. The method of claim 13, wherein the second data rate is higher than the first data rate.

17. The method of claim 13, further comprising:
when the circuit block is configured to employ the first interconnection configuration, controlling the processing circuit to operate at a first clock speed; and
when the circuit block is configured to employ the second interconnection configuration, controlling the processing circuit to operate at a second clock speed slower that the first clock speed.

18. The method of claim 13, wherein the circuit block is part of a wireless communication apparatus.

19. The method of claim 18, wherein the predetermined signal processing operation is a digital pre-distortion (DPD) operation.

20. The method of claim 18, wherein the step of using the rate-conversion circuit to convert the first input signal into the first output signal comprises:
performing a first upsampling filtering operation upon the first input signal;
performing a sampling rate conversion upon an output of the first upsampling filtering operation; and
performing a second upsampling filtering operation upon an output of the sampling rate conversion to generate the first output signal.

21. The method of claim 18, wherein the wireless communication apparatus is a multi-mode communication apparatus; and the method further comprises:
when the wireless communication apparatus is operated under one communication mode, configuring the circuit block to employ the first interconnection configuration; and
when the wireless communication apparatus is operated under a different communication mode, configuring the circuit block to employ the second interconnection configuration.

22. The method of claim 18, wherein the wireless communication apparatus is a single-mode communication apparatus; and the method further comprises:
when the wireless communication apparatus is operated under one signal bandwidth of a communication mode, configuring the circuit block to employ the first interconnection configuration; and
when the wireless communication apparatus is operated under a different signal bandwidth of the communication mode, configuring the circuit block to employ the second interconnection configuration.

\* \* \* \* \*